United States Patent [19]

Griffin

[11] B 3,921,010

[45] Nov. 18, 1975

[54] PEAK VOLTAGE DETECTOR CIRCUITS

[75] Inventor: Roger Thomas Griffin, Flackwell Heath, England

[73] Assignee: RCA Corporation, New York, N.Y.

[22] Filed: Aug. 20, 1973

[21] Appl. No.: 389,726

[44] Published under the Trial Voluntary Protest Program on January 28, 1975 as document no. B 389,726.

[30] Foreign Application Priority Data

Dec. 18, 1972 United Kingdom .............. 58282/72

[52] U.S. Cl. ............ 307/235 A; 307/205; 307/214; 307/215; 307/217; 328/150

[51] Int. Cl.[2] .................. H03K 5/153; H03K 19/38; H03K 19/40

[58] Field of Search ........... 307/235 R, 235 A, 213, 307/214, 215, 205, 251, 255, 279, 304, 218, 217

[56] References Cited

UNITED STATES PATENTS

| | | | |
|---|---|---|---|
| 3,304,437 | 2/1967 | Dano | 328/127 X |
| 3,356,858 | 12/1967 | Wanlass | 307/214 X |
| 3,431,433 | 3/1969 | Ball et al. | 307/221 C |
| 3,471,714 | 10/1969 | Gugliotti, Jr. et al. | 307/255 X |
| 3,599,018 | 8/1971 | Washizuka et al. | 307/251 X |
| 3,601,629 | 8/1971 | Cricchi | 307/205 |
| 3,610,964 | 10/1971 | Hatano et al. | 307/214 X |
| 3,631,528 | 12/1971 | Green | 307/251 |
| 3,654,486 | 4/1972 | Cubert | 307/214 |
| 3,728,556 | 4/1973 | Arnell | 307/304 X |
| 3,739,193 | 6/1973 | Pryor | 307/251 X |

OTHER PUBLICATIONS

Coppen, "FET Complementary Integrated Circuits:Aerospace Natural," Electronics (pub.), 12/28/1964, pp. 55–58.

*Primary Examiner*—Rudolph V. Rolinec
*Assistant Examiner*—L. N. Anagnos
*Attorney, Agent, or Firm*—H. Christoffersen; Samuel Cohen

[57] ABSTRACT

A feedback circuit between the output and input terminals of a complementary-symmetry, metal-oxide-semiconductor (CMOS) circuit, such as an inverter circuit, quiescently biases the circuit at a point on its transfer characteristic such that a slight additional change in voltage level will cause the circuit to change state. Input signal is applied to the input terminal through a coupling element such as a capacitor. When this input signal starts to decrease after reaching its peak voltage value in a given sense, it causes the feedback circuit to open and the CMOS circuit to change to its second state. In response to each following peak of the same sense, the feedback loop momentarily closes then opens and concurrently the circuit momentarily reverts to its initial state then switches to its second state.

37 Claims, 21 Drawing Figures

PEAK VOLTAGE DETECTOR CIRCUITS

The circuits of the present application are peak voltage detectors which are useful in horological and in other applications. The major portion of these circuits may be integrated using CMOS technology. Only one or two passive components external of an integrated circuit are needed, depending upon the particular application.

Circuits embodying the invention are illustrated in the drawing of which:

Figures 1, 2, 3, 4, 5, 6, 7:
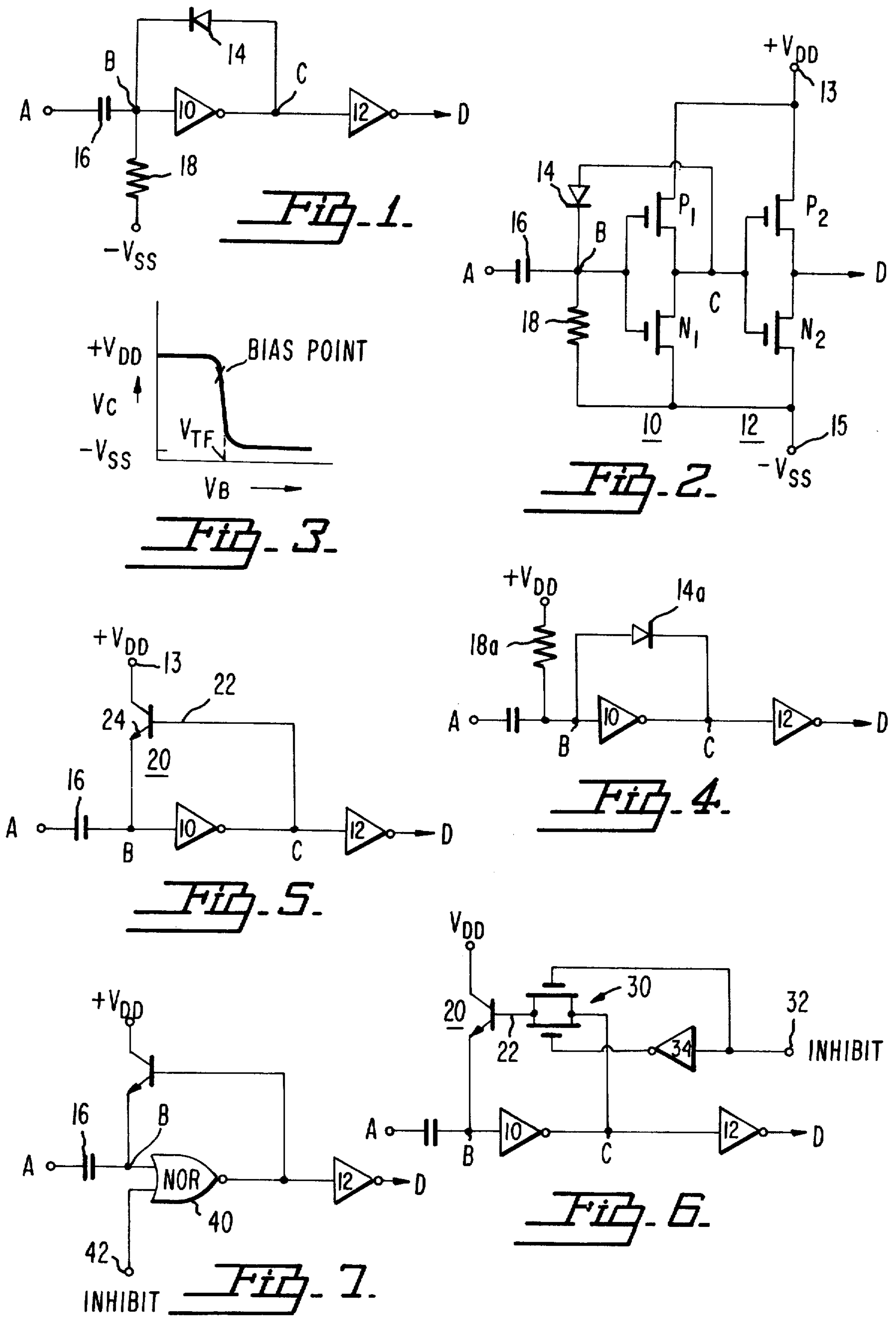
FIG. 1 is a block and schematic circuit diagram of an embodiment of the invention.
FIG. 2 is a circuit diagram illustrating the embodiment of FIG. 1 in more detail.
FIG. 3 shows the transfer characteristic of one of the inverters of FIGS. 1 and 2.
FIG. 4 is a block and schematic circuit diagram of a second embodiment of the invention, this one for detecting positive voltage peaks.
FIGS. 5 and 6 are block and schematic showings of third and fourth embodiments of the invention, respectively.
FIG. 7 is a block and schematic circuit diagram of another embodiment of the invention.

the circuits of FIGS. 1 and 2 include a first inverter 10 connected at its output terminal C to the input terminal of a second inverter 12. The inverters preferably are CMOS inverters each comprising a P type transistor and an N type transistor. Using inverter 10 as an example, the conduction paths of the two transistors are connected in series between a first terminal 13 at which one operating voltage $+V_{DD}$ is applied and a second terminal 15 at which a second operating voltage $-V_{SS}$ is applied. The two gate electrodes are joined to form an input terminal at B and the connection between the transmission paths forms an output terminal at C.

The input terminal A of the circuit is coupled to the input terminal B of the first inverter through a coupling capacitor 16. In the embodiment of FIG. 2, a resistor 18 connects between voltage supply terminal 15 and the inverter input terminal B. In some embodiments of the invention it is not essential that this resistor be present. There is a feedback path from output terminal C to input terminal B which in the embodiment of FIG. 2 comprises a diode 14.

In the operation of the circuit of FIGS. 1 and 2, it may be assumed that point B initially is at a relatively negative value in view of the connection of node B to the operating voltage terminal 15 through resistor 18. This causes the conduction path of transistor $P_1$ to exhibit a low impedance and the conduction path of transistor $N_1$ to exhibit a high impedance. Current now flows from the positive operating voltage terminal 13 through the conduction path of transistor $P_1$ and through diode 14 and resistor 18 to the operating voltage terminal 15. As a result of this current flow, input terminal B becomes relatively positive, that is, it is at a voltage less than that present at point C by one diode voltage drop. In mathematical terms, $V_C = V_B + V_{14}$ where $V_c$ is the voltage at point C, $V_{14}$ is the voltage across diode 14, and $V_B$ is the voltage at input terminal B.

While one might believe, upon initial consideration, that the biasing as described above would cause transistor $P_1$ to cut off, the circuit parameters are such that this does not occur. The transistor $P_1$ continues to conduct as its source electrode is sufficiently positive compared to its gate and drain electrodes but transistor $N_1$ becomes conductive. The circuit thus assumes a quiescent state in which transistors $P_1$ and $N_1$ both conduct and $V_C=V_B+V_{14}$. The quiescent biasing point is on the vertical portion of the characteristic close to the knee of the characteristic. For operation from low supply voltages, it is desirable that the width of the conduction channel of the N-device $N_1$ be made larger than that of the P-device, $P_1$. This effectively shifts the transfer characteristic of FIG. 3 to the left relative to the circuit operating point to thereby obtain relatively stable biasing slightly beyond the knee, even with small values of $V_{DD}-V_{SS}$, as shown. The ratio of the widths of the channels of transistor $P_2$ and $N_2$, used for inverter 12, is chosen to be the same as that of inverter 10. A more detailed discussion of the quiescent condition of the circuit, certain design parameters and related matters is given later at the end of the application.

The transfer characteristics of inverters 10 and 12 can be well matched in the manner discussed above when fabricated adjacent to each other on an integrated circuit. With the biasing as indicated and with the matching characteristics as described, the voltage present at point C is relatively positive and the voltage present at point D is relatively negative and approximately equal to $-V_{SS}$. The output voltage $V_D$ is negative because transistor $N_2$ is in its low impedance condition and transistor $P_2$ is in its high impedance condition. For purposes of the present application, the relatively negative voltage above may be considered to represent binary 0 and a relatively positive voltage to represent binary 1.

Assume now that a regularly varying voltage such as a sinusoid is applied to input terminal A. During the first negative excursion of the input voltage, the capacitor 16 charges through diode 14 and conducting transistor $P_1$ and causes a voltage to develop between points A and B which is relatively positive at B. When the input voltage passes its most negative point and starts to go positive, the diode stops conducting and the voltage at point B, which is now no longer clamped to a level one diode drop lower than $V_C$, starts to follow the voltage at point A. A slight positive increment of the voltage at input B then causes the circuit quickly to change state. As already mentioned and as shown in FIG. 3, the circuit is quiescently biased on the vertical portion of the characteristic close to the upper knee and a slight increase in $V_B$ causes a much larger change (decrease) in $V_C$. Referring to FIG. 2, as the derivative $dV_A/dt$ changes from O (the most negative part of the varying input voltage) to a positive value, ($V_A$ is still negative but it is now increasing in value—the slope has become positive), transistor $P_1$ is quickly driven to cut off and transistor $N_1$ is driven further into conduction. This, in turn, causes transistor $P_2$ to turn on and transistor $N_2$ to cut off and $V_D$ goes positive to approximately $+V_{DD}$ (binary 1). Thus, so long as the bias point occurs as indicated and the characteristics of inverters 10 and 12 are matched, as they would be in an integrated circuit, correct operation is independent of the absolute change in the position of the transfer characteristic due to process parameter variations.

If the time constant of the resistor capacitor combination is large compared to the period of the input waveform, then point D remains at a logical 1 level until the next negative excursion of the input waveform and switches to a logical 0 only during the most negative part of the input waveform. Referring to FIG. 2, it was previously explained how when $dV_A/dt$ goes from 0 to plus after the first negative peak at A, $V_B$ goes positive relative to $V_C$, diode 14 stops conducting, $P_1$ turns off, and transistor $N_1$ turns on. The capacitor 16 previously was charged through the diode 14 and the conduction through transistor $P_1$. The charge on this capacitor now attempts to leak off. However, if resistor 18 is of relatively larger value, the time required is relatively long. Therefore, the transistor $P_1$ remains off and transistor $N_1$ on. However, the voltage at A is a varying voltage and after reaching its negative peak, goes positive and after reaching its positive peak, again starts to go negative. At the positive peak, point B is highly positive and the condition of transistors $P_1$ and $N_1$ remains undisturbed, that is, $P_1$ is off and $N_1$ is on. However, as the voltage at A goes more and more negative, the voltage at B drops correspondingly. The circuit parameters can be such that when point A gets close to its negative peak, the voltage at point B becomes sufficiently relatively negative to change the conducting states of transistors $P_1$ and $N_1$, that is, to switch transistor $P_1$ to the conducting state and transistor $N_1$ to the cut off state. This, in turn, causes $V_D$ to change from $+V_{DD}$, representing a 1, to $-V_{SS}$, representing a 0.

The change in state just described occurs at the negative peak of the input signal at A. When the change in state occurs, the feedback loop 14 again becomes active and any charge lost by capacitor 16 is replenished via this loop, that is, via conduction from terminal 13 through the conduction path of transistor $P_1$ and the diode 14, to capacitor 16.

When the voltage at point A reaches its negative peak and then starts going positive, that is, when the slope at $V_A$ changes from O to a positive value, the same process already discussed reoccurs. The voltage $V_B$ starts to go positive relative to $V_C$, cutting off diode 14, and causing $P_1$ to cut off and $N_1$ to conduct, and causing $V_D$ again to change from 0 to 1. Thus, the circuit of FIGS. 1 and 2 produces an output pulse (negative-going) of short duration and time coincident with the negative peaks of the input wave at A.

Figure 9:
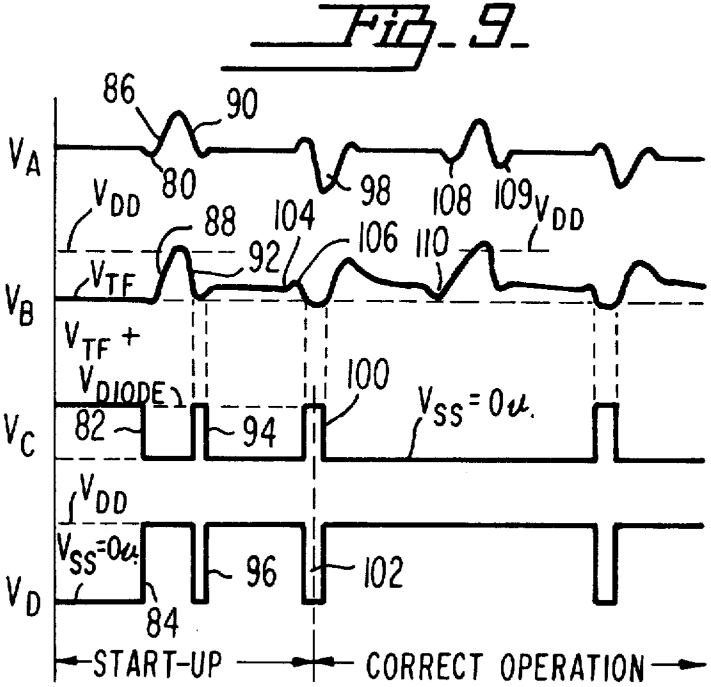
FIG. 9 is a drawing of waveforms to help explain the operation of the circuit of FIGS. 1 and 2.

The waveforms of FIG. 9 describe the circuit operation discussed above in one particular application. The input wave $V_A$ is one which is produced by the balance wheel of an electronic watch. The motion of the balance wheel is maintained by detecting the position of the balance wheel as small permanent magnets on the balance wheel pass a fixed coil, and supplying energy to the balance wheel at the correct time. The waveform $V_A$ results in such a system and is produced by the voltage induced in the coils as the magnets oscillate backward and forward across the coil. This wave is the one which is applied to input terminal A of FIGS. 1 and 2.

Figure 14:
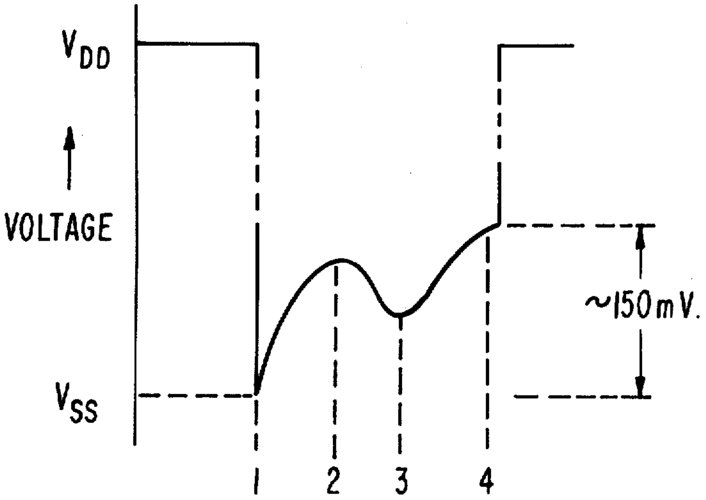
FIG. 14 shows a waveform which is referred to in the explanation of the operation of the circuit of FIG. 10.

The circuit initially is biased as shown in FIG. 3. This bias point corresponds to a quiescent voltage $V_{TF}$ at the point B in the circuit, as shown in FIG. 9 waveform $V_B$. The initial negative excursion 80 of wave $V_A$ causes conduction through the diode 14 and the voltage $V_B$ at point B follows that at point A. As $V_A$ starts to go positive, the inverter 10 changes state, that is, the transistor $P_1$ is cut off and the transistor $N_1$ conducts and inverter 12 also changes state. The result is that the voltage $V_C$ goes from its initial value $V_{TF}+V_{diode}$ where $V_{diode}$ is the voltage across diode 14, to the value $V_{SS}$ (assumed to be at ground). This is shown ias the transition 82 in the wave $V_C$. Correspondingly, the voltage $V_D$ goes from a value of 0 volts to $V_{DD}$ as shown at 84 in FIG. 14.

The subsequent positive excursion 86 of the input wave $V_A$ causes the voltage $V_B$ to follow this excursion as shown at 88. (It is assumed that the time constant of the capacitor 16 and resistor 18 is large compared to the period of the balance wheel, which period is 250 milliseconds (ms) for a 4 Hz balance wheel). As transistor $P_1$ remains off and transistor $N_1$ remains on, $V_C$ remains at $V_{SS}=0$ volts and $V_D$ remains at $V_{DD}$.

As the waveform $V_A$ falls after its initial peak as shown at 90, the voltage $V_B$ follows the voltage $V_A$ as shown at 92. Point B reaches the value of $V_{TF}$ volts an instant before the voltage $V_A$ reaches its second minimum, due to the presence of resistor 18 which discharges the capacitor slightly. When the wave $V_B$ reaches the voltage $V_{TH}$, the inverter 10 changes state, diode 14 and transistor $P_1$ conduct, and the inverter 12 changes state. A short time later when wave $V_B$ starts to go positive diode 14 cuts off and the inverters 10 and 12 change state again. This is shown in FIG. 9 by the positive pulse 94 (the voltage $V_C$) and the corresponding negative pulse 96 (the voltage $V_D$).

The major negative excursion 98 of the wave $V_A$ which follows next at point A has a similar effect to that discusssed above. When $V_A$ reaches its negative peak, a positive pulse 100 is produced at $V_C$ and a negative pulse 102 is produced at $V_D$. With the correct choice of time constant for resistor 18 and capacitor 16, although the capacitor discharges between successive negative-going excursions, point B remains above $V_{TF}$ volts until each major negative peak is reached. Thus, for example, at the point 104 just before the positive swing at 106 the wave $V_B$ has a voltage higher than $V_{TF}$. Similarly, when $V_A$ goes slightly negative as shown at 108, although wave $V_B$ follows as shown at 110 it does not go sufficiently negative to reach $V_{TF}$. Therefore transistor $P_1$ of FIG. 2 remains cut off and diode 14 does not conduct. In other words, in response to the relatively low amplitude negative pulses such as 108 and 109 the inverters 10 and 12 do not change state and in this sense the circuit effectively has a threshold level.

Summarizing the above, for all periods when the voltage $V_B$ is greater than $V_{TF}$, the voltage $V_C$ will be at 0 volts (and the voltage $V_D$ will be at $V_{DD}$ volts.) When the voltage $V_B$ is at (or slightly below) $V_{TF}$ volts, then the voltage $V_C$ is at $V_{TF}+V_{diode}$ volts. Since the transfer characteristics of inverters 10 and 12 are matched, the voltage $V_C$ will switch from $V_{DD}$ volts to 0 volts only when point B reaches the voltage $V_{TF}$ volts. The voltage $V_D$ remains at $V_{DD}$ volts for all times when the voltage at $V_B$ is greater than $V_{TF}$.

The width of the output or "detection" pulse at point D may be adjusted by changing the time constant of the resistor-capacitor combination. Clearly, if resistor 18 is lowered in value, the charge on capacitor 16 will discharge more rapidly and the detection pulse width at a particular input signal frequency will increase. The reverse occurs when the value of resistor 18 is increased. The use of a very large value of resistance is of particular interest in cases in which the input frequency is very low, and in cases, at higher frequencies, where detection is required just as the very peaks of the negative-going input waveform. At the limit, the resistor 18 may be eliminated entirely and the internal leakage of the capacitor and the input impedance of the CMOS inverter 10 employed as the discharge path for capacitor 16. The greater the impedance of this discharge path, the smaller the width of the detection pulse at a given input frequency.

The values chosen for the various parameters of the circuit of FIG. 2 will depend upon the particular application for the circuit. The value of the capacitor 16 may be in the general range of 1,000 picofarads (pF) to 1 microfarad (uF). In a circuit suitable, for example, for the detection of the position of a balance wheel, oscillating at 4 Hz, the capacitor may have a value of 0.5 uF and the resistor may have a value of 10 megohms. The voltage $V_{DD}$ may be that provided by a small battery such as 1.3 volts and $-V_{SS}$ may be at ground; however, other values are possible. The relative widths of the P and N channel transistors may be 2 mils for P-channel and 14 mils for the N-channel, as examples.

The circuit of FIG. 4 is analogous to the circuit of FIG. 3 but is designed for positive rather than negative peak detection. Note that the diode 14a is poled oppositely from the diode of FIGS. 1 and 2 and that the resistor 18a connects input terminal B to the terminal for the $+V_{DD}$ voltage rather than to the $-V_{SS}$ voltage terminal. In this circuit the relative planned widths are preferably such as to place the quiescent bias point closer to the lower knee than the upper knee.

For minimum power dissipation and because of the advantage already mentioned of shifting the transfer characteristic of FIG. 3 to the left, it is desirable that the P channel transistors $P_1$ and $P_2$ of FIG. 2 be relatively small. This limits the current available to charge the capacitor 16 because this current must pass through the conduction path of relatively limited current carrying capacity of transistor $P_1$. The circuit of FIG. 5 provides one solution to this problem. Here the feedback from point C is employed to control the conduction of a NPN transistor 20. The base 22 of this transistor is connected to output terminal C and the emitter 24 to input terminal B. The collector of the transistor is connected to terminal 13 for the voltage supply $+V_{DD}$.

In the operation of the embodiment of FIG. 5, the limited current carrying capacity of transistor $P_1$ of inverter 10 (see FIG. 2) does not adversely affect the circuit operation. This limited capacity is adquate to provide sufficient base-emitter current to transistor 20 to permit this transistor to draw relatively heavy collector-emitter current. In other words, the current available for charging the capacitor 16 is supplied directly from terminal 13 and through the collector-to-emitter path of transistor 20 and it does not depend upon the conduction characteristics of the transistor $P_1$ of the inverter.

The NPN bi-polar transistor 20 of FIG. 5 may be a lateral transistor and may be constructed using the CMOS process by using the P well diffusion i.e. the substrate diffusion for the N-channel MOS transistors) as a base and the source and drain diffusions (low resistivity) of the N-channel MOS transistors as collector and emitter, or the NPN transistor may be formed by use of the N+ diffusion as emitter, P well diffusion as base and the N substrate as collector.

It is sometimes desirable to inhibit operation of the detector circuit for the purpose, for example, of selecting from among different minima (or maxima) in the input signal. FIG. 6 shows one circuit for this kind of operation. It includes a CMOS dual transmission gate 30 located between the output terminal C and the base 22 of transistor 20. The inhibit signal terminal 32 is connected directly to the gate electrode of one of the MOS transistors and through inverter 34 to the gate of the other MOS transistor.

Figure 8:
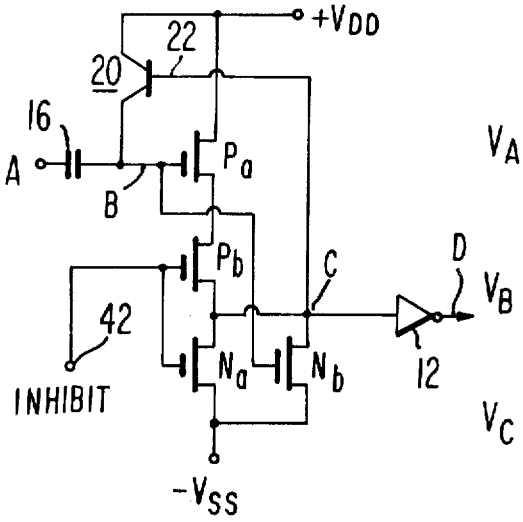
FIG. 8 is a schematic circuit diagram of the embodiment of FIG. 7.

In operation, when the inhibit signal has one value, the two transistors of transmission gate 30 are in the high impedance state and the feedback path is effectively open. With the feedback path open, the circuit does not operate, that is, it is not responsive to the peaks of the signal present at A. When the inhibit signal is changed to a second value, both transistors of the dual transmission gate 30 are placed in their low impedance condition and therefore the output terminal C connects to base 22 via a low impedance path. In this condition, the circuit operates in the manner already discussed in connection with FIG. 5. Of course a diode such as 14 of FIG. 1, rather than a transistor 20 may be used for the feedback, if desired.

the circuit of FIGS. 7 and 8 also permits inhibit operation. Here, a NOR gate 40 is substituted for inverter 10 of the previous figures. The NOR gate incudes four transistors (see FIG. 8) two ($P_a$ and $P_b$) of P type and two ($N_a$ and $N_b$) of N type. The conduction paths of transistors $P_a$, $P_b$ and $N_a$ are connected in series between the operating voltage terminals and the conduction path of transistor $N_b$ is connected in parallel with that of transistor $N_a$. Input terminal A connects through capacitor 16 to NOR gate input terminal B, and terminal B connects to the gate electrodes of transistors $P_a$ and $N_b$. The inhibit terminal 42 connects to the gate electrodes of transistors $P_b$ and $N_a$.

In operation, if the inhibit voltage is relatively positive, transistor $P_b$ is cut off and output terminal C of the NOR gate is clamped to $-V_{SS}$ representing a 0. Output terminal D of inverter 12 is clamped to $+V_{DD}$ representing a 1. The signal present at A, if any, has no effect on the circuit operation.

When the inhibit voltage is made relatively negative, transistor $P_b$ is placed in the low impedance condition and transistor $N_a$ is cut off. Now the operation is the same as that of the circuit described with the conduction paths of transistors $P_a$ and $N_b$ effectively connected in series (through transistor $P_b$) between the supply terminals, and with their control or gate electrodes connected to point B.

In brief, if B initially is assumed to be relatively negative, transistor $P_a$ conducts and point C goes relatively positive. This causes transistor 20 to turn on (base current is supplied from $+V_{DD}$ through the conduction paths of transistors $P_a$ and $P_b$) and point B becomes relatively positive but not so positive as to cause transistor $P_a$ to cut off. The circuit biasing point is at the vertical flank of the characteristic, close to the upper knee, as shown in FIG. 3. The remainder of the circuit operation is exactly like that already discussed in detail.

Figure 10:
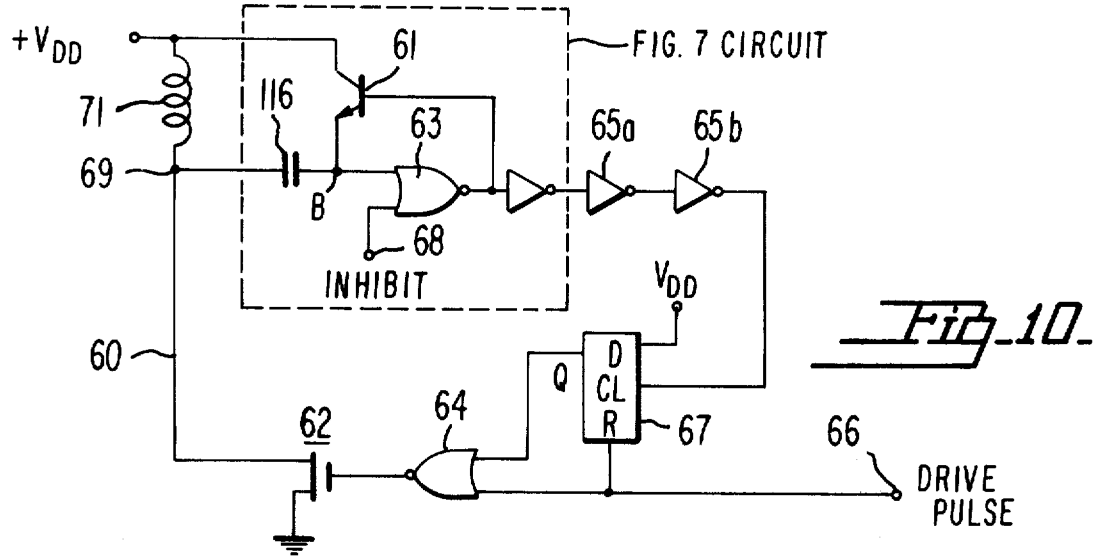
FIG. 10 is a block and schematic circuit diagram of an embodiment of the invention which is especially useful for driving a stepping motor.

FIG. 10 illustrates another application of the invention in watch circuits, this time for use with stepping motors. A stepping motor driver with a pulse from a MOS driver transistor 62 exhibits the characteristic shown in FIG. 14. The voltage at the MOS driven falls initially to $V_{SS}$, which may be assumed to be ground level for purposes of the present explanation, and which is shown at point 1 in FIG. 14, this voltage then increases as current increases in the inductive winding 71 of the motor to point 2. Once the motor starts to move, a back electromotive force (EMF) is developed which effectively reduces the current. This continues until the motor has passed its maximum velocity, point 3 of FIG. 14, and slows down as it approaches the next "rest" position, when the current (and thus the voltage across the MOS transistor) increases to its quiescent value shown at point 4. Any energy which is supplied after the motor reaches its maximum velocity is wasted. The motor pulse thus may be terminated at this point.

For the reason above, a circuit which automatically adjusts the width of the pulse applied to the motor winding to its optimum value, as is done in FIG. 10 is very desirable in obtaining a most efficient system. To give an example, a wide pulse may be required in a wrist watch once every 24 hours to supply the added energy to turn over a calender indicator but the width of the pulse may be reduced for the rest of the time.

The circuit shown in FIG. 10 includes the circuit of FIGS. 1 and 2 but with the addition of a bipolar transistor 61 as in FIG. 5 and an inhibit input terminal 68 to a NOR gate 63 as in FIG. 7. The circuit of FIG. 10 thus comprises the circuit of FIG. 7 followed by two shaping inverters 65*a*, 65*b*, with inverter 65*b* driving the clock terminal CL of a resettable D type flip-flop 67.

Figure 15:
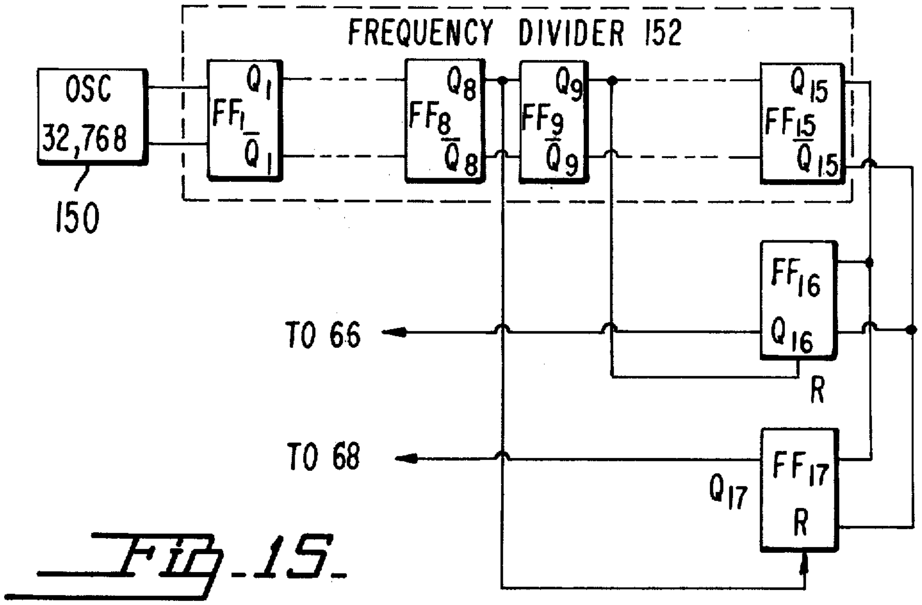
FIGS. 15 and 16 are block diagrams of circuits for producing various control signals for the circuit of FIG. 10.

The reset terminal (R) of flip flop 67 is driven from a counter chain (shown in FIG. 15) which provides a pulse (negative going) of the maximum width required to drive the stepping motor under all possible load conditions. One output of the circuit of FIG. 15 is applied to terminal 66 which connects both to NOR gate 64 and to the reset terminal of flip flop 67. The second input to NOR gate 64 is the Q output of flip-flop 67. The NOR gate 64 drives a large N-type MOS transistor 62 which is connected to one terminal 69 of the stepping motor winding 71. Terminal 69 is also connected to the input terminal B of NOR gate 63 via the capacitor 16.

In the operation of the circuit of FIG. 10, the wave applied to terminal 66 normally represents a 1 (a relatively high voltage level such as $V_{DD}$) so that the flip flop 66 is reset and the NOR gate 64 is disabled. The disabled gate produces an output representing a 0 (a low level such as $V_{SS}$=0 volts) which it applies to the gate electrode of transistor 62, cutting that transistor off.

Figure 11:
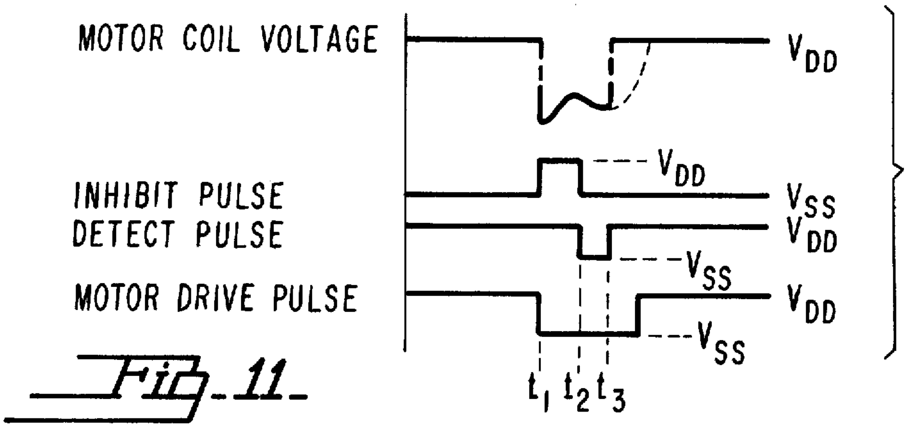
FIG. 11 is a drawing of waveforms present in the circuit of FIG. 10.

At time $t_1$ of FIG. 11 the drive pulse at terminal 66 changes from a 1 to a 0. As flip-flop 67 is reset, Q is also 0 so that the NOR gate 64 becomes enabled (produces a 1 output) and transistor 62 turns on. Concurrently with the change in value of the signal on terminal 66 from a 1 to a 0, the inhibit pulse applied to terminal 68 is switched from a 0 to a 1 level (time $t_1$ of FIG. 11).

This inhibit pulse also is produced by the circuit of FIG. 15 as discussed shortly. The inhibit pulse remains a 1 for a fixed time ($t_1$ to $t_2$ of FIG. 11) which is generally chosen so that the voltage across the conduction path of the MOS transistor 62 has passed its maximum point corresponding to point 2 in FIG. 14. This is necessary to prevent the detection of the initial negative pulse.

Once the inhibit pulse is removed (time $t_2$), then the detector circuit comes into operation. When the next minimum of the motor coil voltage is reached at time $t_3$ (point 3 in FIG. 14) the detector produces an output pulse and a shaped version (detect pulse) of this pulse is applied by inverter 65*b* to the clock terminal of the flip flop 67. The pulse first changes from a 1 to a 0 level. Then as the voltage across the conduction path of the MOS transistor 62 passes its minimum and starts to increase, the pulse changes from a 0 level back to a 1 level. This last change in level switches the state of the flip-flop, that is, it causes Q to change from 0 to 1. This disables the NOR gate 64 and transistor 62 turns off and so terminates the pulse applied to the motor, at the optimum point, as shown in FIG. 11.

If desired, the single transistor 62 may be replaced by a complementary symmetry (CMOS) inverter. The presence of the P channel transistor in such an inverter helps turn off the motor more positively and also helps to dissipate the energy stored in the inductive windings of the motor.

Referring now to FIG. 15, this circuit includes an oscillator 150, a frequency divider 152 consisting of 15 flip flops FF1–FF15 and two additional flip flops FF16 and FF17. The oscillator 150 is preferably crystal controlled and drives the frequency divider 152. The last flip-flop FF15 of the divider drives the flipflops FF16 and FF17 in parallel. The reset terminal of flip flop FF16 is driven by the Q output of flip flop FF9 and the reset terminal of flip flop FF17 is driven by the Q output of flip flop FF8.

With the connections as shown, $\overline{Q}_{16}$ changes from a 1 to a 0 on the arrival of the negative edge of $Q_{15}$ and resets back to 1 after 7.81 ms when the Q output of flip flop FF9 changes from 0 to 1. The inhibit pulse is derived similarly from flip flop FF17 where in this case the Q output of flip flop FF17 changes from 0 to 1 and is then reset back to 0 after 3.91 ms by the arrival of a positive-going pulse from the Q output of flip-flop FF8. It is of course possible to adjust both the drive pulse width and the inhibit pulse width by adjustment of the reset connections from the flipflops shown to other flip flops of the chain.

Figure 16:
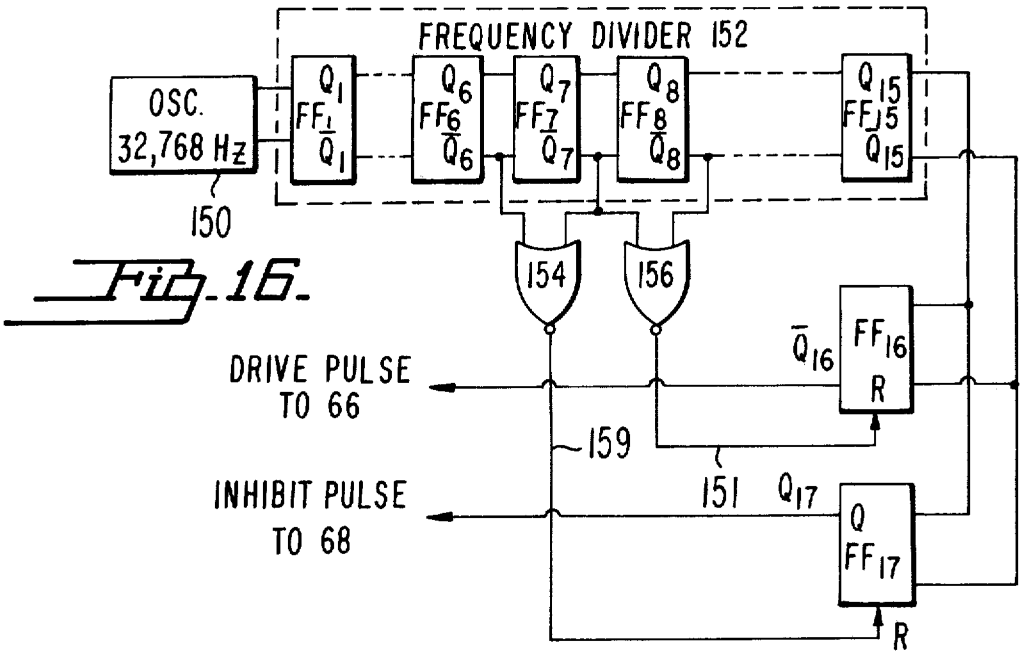
Figure 17:
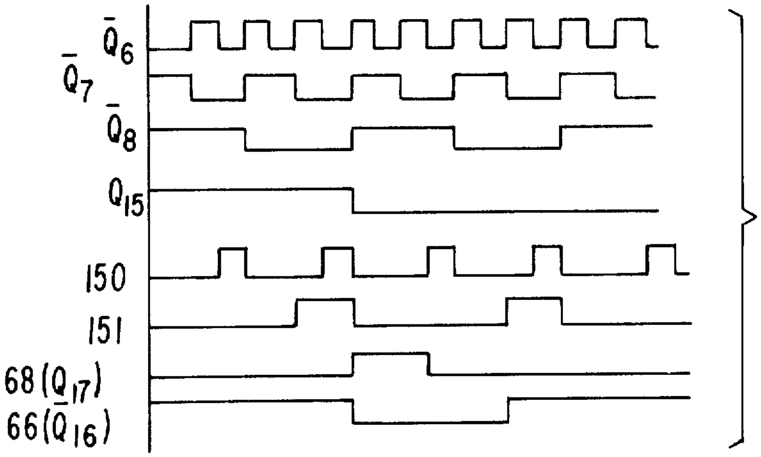
FIG. 17 is a drawing of waveforms produced in the circuit of FIG. 16.

With the circuit of FIG. 15, the pulse widths are of values of $2^{-n}$, where n is a integer. A case of particular interest is that where values other than $2^{-n}$ can be obtained, for example $2^{-n1} + 2^{-n2}$. FIG. 16 shows a modification of the circuit of FIG. 15 which permits this. In this case the reset terminals of flip flops FF16 and FF17 are driven by two NOR gates 154 and 156 respectively. NOR gate 154 receives inputs $Q_6$ and $Q_7$ and NOR gate 156 receives input $\overline{Q}_7$ and $\overline{Q}_8$. With the particular connections shown in FIG. 16, the drive pulse width is 5.86ms = 3.91 + 1.95ms and the inhibit pulse width is 2.93 = 1.95 + 0.98ms. FIG. 17 shows the waveforms of the operation of the circuit of FIG. 16.

In the circuits described up to this point the feedback loop, comprising either a diode or the emitter-base diode of a transistor, has a loading effect on the circuit, that is, when the feedback loop is active, it draws current. In the case of a circuit such as shown in FIGS. 7 and 8, where the N type transistors may have relatively low impedances compared to the P type transistors, this current flow may, under some operating conditions, cause the voltage at point C to drop sufficiently, prematurely to switch the inverter 12.

There also may be a problem in a circuit such as shown in FIG. 5, when that circuit is operated at a relatively low value of power supply voltage $V_{DD}$–$V_{SS}$. For purpose of this discussion, assume $V_{SS}$ is at ground. The voltage at point B at the quiescent bias point $V_{TH}$ is one diode (base-emitter) drop beneath $V_C$ (the conducting path is from $V_{DD}$ through $P_1$ (see FIG. 2) through 22, 24 to B) and $V_C$ is close to $V_{DD}$. Using a silicon bi-polar transistor, this means that point B must quiescently be at $V_{DD}$ minus about 0.4 to 0.5 volts and with $V_{DD}$ in say the 1 to 1.5 volt range, this is a significant fraction of $V_{DD}$. This, in turn, imposes a maximum limit on the value of the N-channel transistor threshold voltage, namely $V_T < V_{DD} - V_{14}$. If the diode drop could be eliminated or reduced, this problem could be alleviated and lower supply voltages $V_{DD}$ could be employed.

The circuit of FIG. 12 was developed in response to the problems above although it has other weaknesses, discussed later. Here the feedback circuit includes a P type MOS transistor $P_f$. The gate electrode 50 of this transistor is connected to the output terminal D of the circuit rather than to node C of the circuit as in the previous figures. The conduction path of transistor $P_f$ is connected between the $+V_{DD}$ operating voltage terminal and input point B of the circuit. The diode 51, shown in phantom view, is a parasitic element connected between the substrate 53 and drain 55 electrodes of the transistor and since the substrate is connected to $V_{DD}$ in this particular circuit the cathode of diode 51 also is connected to $V_{DD}$.

Figure 12:
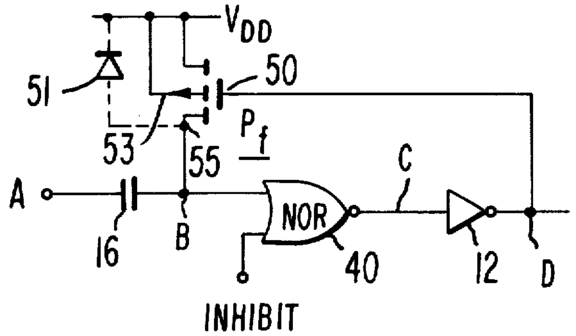
FIGS. 12 and 13 are block and schematic circuit diagrams of other embodiments of the invention.

In the operation of the circuit of FIG. 12, in the absence of the inhibit signal (inhibit terminal relatively negative) and assuming that B is relatively negative, NOR gate 40 conducts, point C is relatively positive and point D is relatively negative. This negative voltage $V_D$ (which is equal to $-V_{SS}$) is a forwaard bias for P type transistor $P_f$. However, as the input impedance of the transistor $P_f$ is extremely high, essentially no current is drawn by the gate electrode 50. Therefore, the transistor $P_f$ provides little loading on either the NOR gate 40 or on the output inverter 12.

When transistor $P_f$ is forward biased, as indicated, the conduction path of this transistor is in its relatively low impedance condition and point B goes relatively positive. The circuit parameters, however, can be such that the NOR gate 40 continues to conduct and the circuit is quiescently biased on the vertical flank of the characteristic close to the knee, as indicated in FIG. 3. If the impedance of the conduction channel of transistor $P_f$ (which has to be carefully selected for proper operation of this circuit) is made reasonably high in the conducting condition of the channel, the resulting relatively large time constant that exists with the capacitor 16, results in the voltage at point B increasing relatively slowly. This means that this circuit should not be used where wide variations in temperature and in $V_{DD}$ are likely.

The parasitic diode 51 in the circuit of FIG. 12 is useful when the circuit is employed for driving a stepping motor as discussed in connection with FIG. 10. In such operation, it is desirable to discharge the capacitor between successive pulses to allow for slight variations in amplitude between such pulses. Such discharge occurs through the diode when the input at A goes positive and attempts to drive point B above $V_{DD}$. Similar operation can be achieved in the circuits of FIGS. 1, 2, 5 and 7 by including the standard CMOS input "protection" circuit which comprises one diode connected between point B and ground ($V_{SS}$) and another between point B and $V_{DD}$.

However, the diode 51 is not desirable in the application for the circuit discussed in connection with FIG. 9. Here it may be observed that $V_B$ goes positive relative to $V_{DD}$ during each major positive peak of $V_A$. The existence of a diode such as 50 would present this as the diode would conduct whenever $V_B$ attempted to exceed $V_{DD}$. This, in turn, might permit the circuit to detect the minor negative peaks such as 108 and 109, which would be undesirable. Note that no such diode is present in the circuits of FIGS. 1, 2, 5 and 7.

Figure 13:
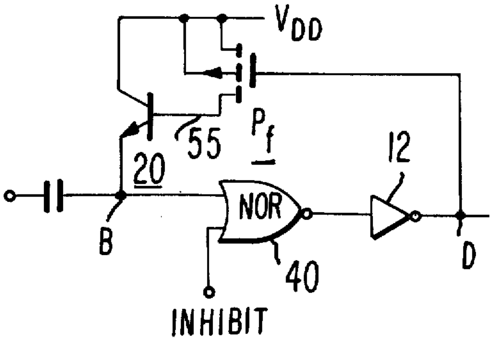

FIG. 13 is a modification of the circuit of FIG. 12 for those applications where a diode connected between points B and $V_{DD}$ is not permitted. Note that the drain 55 of transistor $P_f$ connects to the base of transistor 20 and that the emitter-to-collector path of transistor 20 connects between point B and $V_{DD}$. When the transistor 20 is off, it disconnects point B from $V_{DD}$ and the parasitic diode 20 is, in effect, disconnected from point B. Note also that the bipolar transistor 20 has no loading effect on either the output circuit of the NOR gate 20 or on the output circuit of inverter 12.

Figure 18:
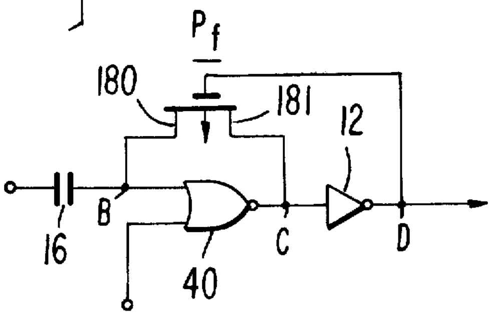
FIGS. 18 and 19 are schematic diagrams of other embodiments of the invention.

The circuit of FIG. 18 is a modification of the circuit of FIG. 12 which does not have the requirement of controlling the impedance of the P type MOS transistor as discussed above. In the circuit of FIG. 18, the drain electrode 180 of transistor $P_f$ is connected to point B just as in the circuit of FIG. 12; however, the source electrode 181 is connected to circuit point C rather than to $V_{DD}$. The transistor so connected, operates as a so-called transmission gate. The operation of the FIG. 18 circuit is close to that of the FIG. 7 circuit. The voltage at point C is still slightly more positive than that at point B during the time that transistor $P_f$ conducts; however, the conduction path of transistor $P_f$ is resistive and the voltage drop at low current can be made lower than the voltage drop across a diode. This circuit has the additional advantage that the sizes of the N and P transistors within the NOR gate 40 (and within inverter 12) need not be mismatched as it is no longer necessary to allow for the diode voltage drop. In fact it may be desirable to reverse the size ratio (make the P device of lower impedance than the N device) so that the vertical part of the characteristic occurs as close as possible to a voltage of value $V_{DD}$ (so that the characteristic of FIG. 3 moves to the right). This permits the maximum voltage to be developed between points C and D, thereby allowing for larger variation in the value of the threshold of P-channel transistor $P_f$. Moreover, it presently appears that such a circuit may be more easily integrated with the manufacturing processs being employed to manufacture silicon gate CMOS devices, where the thresholds for the P channel devices are generally lower than those of the N channel devices.

Figure 19:
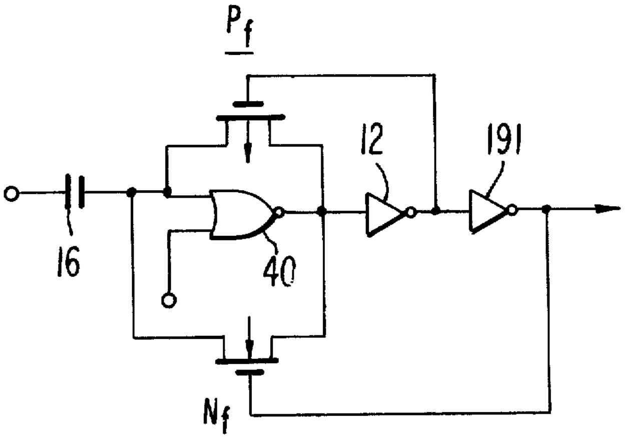

The circuit of FIG. 19 is a modification of the circuit of FIG. 18 in which an N type transmission gate $N_f$ is placed in parallel with the P type transmission gate $P_f$. As in the embodiment of FIG. 18, the output of inverter 12 controls the coduction through transmission gate $P_f$. The gate electrode of transmission gate 190 is connected to the output terminal of the additional inverter 191.

In the circuits of FIGS. 18 and 19, the P-channel feedback transistors $P_f$ have their substrate connected to $V_{DD}$. These circuits thus have the same restrictions on use as does the circuit of FIG. 12 in view of the parasitic diode manifested between point B and $V_{DD}$. This militates against use of these circuits in applications (such as in FIG. 9) where discrimination successive minima is required, for the reasons explained. However, the circuits of FIGS. 18 and 19 can be used in applications (such as that of FIGS. 10 and 11) where it is desired to detect successive minima of variable value, the parasitic diode permitting discharge of the capacitor between the successive minima as previously indicated. The problem of maintaining $V_T<V_{DD}-V_{diode}$ at low supply voltages is lessened in FIGS. 18 and 19 because of the essentially resistive characteristic of MOS transistors between drain and source, when conducting. It is to be noted however that, as with the diode feedback circuits, the feedback circuits of FIGS. 12, 13, 18 and 19 are asymmetrical in their action because of the inclusion of the second inverter, the output of which, at point D, forward biases the feedback transistor $P_f$ for only one relative polarity of the input at point B.

Throughout the application it has been stated that the quiescent bias point should be on the vertical part of the transfer characteristic. Maximum sensitivity results when the circuit is operated in this way, that is, a small change in input signal results in a relatively large change of output signal. However, it is to be understood that the circuit can be operated with the quiescent bias point not on the vertical part of the transfer characteristic if maximum sensitivity is not required.

In many embodiments of the invention the two series connected transistors, one of P type and the other of N type, are stated to have different channel widths so that they exhibit different impedances when conducting. Again, this is not essential to the circuit operation. As implied in the various discussions, when the supply voltage is quite low, of the order of a volt or so, with many of these circuits mismatching of the sizes of the N and P channels is advantageous especially where there is a built in voltage drop of significant size between point C and point B when one of the transistors conducts current into the path from B to C. At higher supply voltage levels, the series connected P and N transistors may be of the same value. The characteristics of the corresponding transistors of two adjacent circuits such as inverters 10 and 12 of FIG. 1 should be matched and such matching is easily achieved when both such circuits are integrated onto a common substrate.

Figure 20:
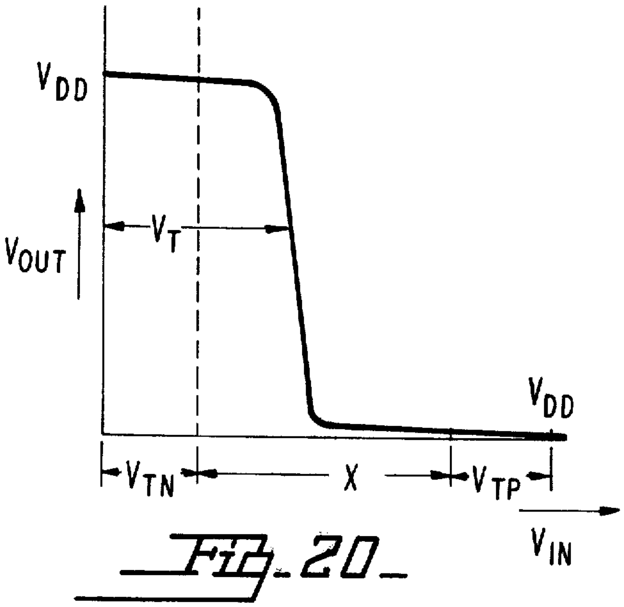
FIGS. 20 and 21 are transfer characteristics referred to in the explanation of the operation of certain of the circuits above.
Figure 21:
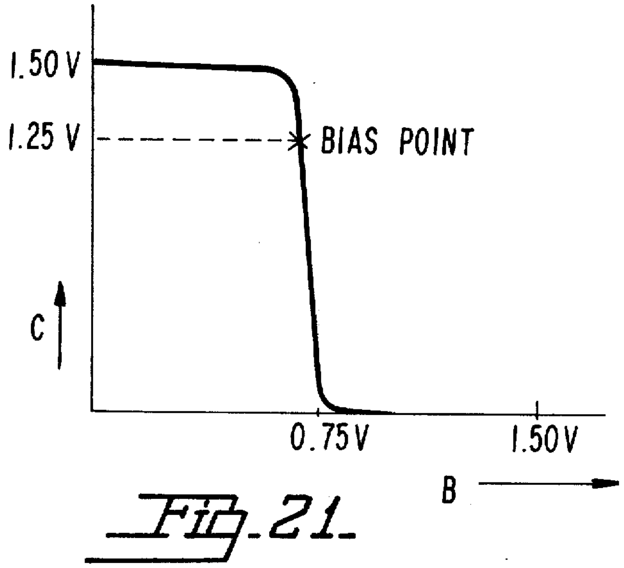

The following discussion supported by numerical examples, is for the purpose of giving a deeper insight into the basic operation of the circuits hereinbefore described. FIGS. 20 and 21 should be referred to.

First a simple COS/MOS inverter (such as inverter 12 comprising transistors $P_2$ and $N_2$ in FIG. 2) and the question of what happens as the input signal (at terminal C in this case) increases in value from 0 volts to $V_{DD}$ will be considered. It is assumed that $V_{DD} < V_{TP} + V_{TN}$, that is the supply voltage $V_{DD}$ is always greater than the sum of the N and P channel thresholds $V_{TP}$, $V_{TN}$. (This condition must be fulfilled for use of COS/MOS inverters with feedback; for example when an inverter is biased with a resistor as an amplifier).

The inverter input-output characteristic is shown in FIG. 20. Now provided that $V_{DD}>V_{TP}+V_{TN}$, a region X must exist where $V_{TN}<V_{IN}<V_{DD} - V_{TP}$, that is, where the *p* and *n* transistors are both ON. The vertical part of the characteristic at $V_T$ above grouund, must fall in this region. The position of this vertical part of the characteristic i.e., the value of $V_T$, is dependent on several factors:

a. The values of $V_{TN}$ and $V_{TP}$.
b. The values of the gain factors $K^1_p$ and $K^1_N$.
c. The relative sizes of the transistors.

In fact, the position of the vertical part of the characteristic at $V_T$ above ground, can be calculated since:

$$I_{dN}=K^1N\ WN/LN\ (V_T - V_{TN})2 \text{ where:}$$

$I_{dN}$ is the saturation drain current of the *n*-device, and WN/LN is the width to length ratio.

A similar equation applies to the p-device.

Assuming no load on the inverter, then in the region of interest $$I_{dN}=I_{dP}$$

and a value for $V_T$ is given by solution of:

$$K^1_N\ WN/LN\ (V_T - V_{TN})^2 = K^1_p\ WP/LP\ (V_{DD} - V_T - V_{TP})^2$$

It can be seen from the expression above that the value of $V_T$ depends on WN and WP.

Returning now to FIGS. 1 and 2, as point A falls from $V_{DD}$, point B will follow, until point B reaches a value of $V_T$ above 0 volts. At this point the output will rise rapidly, and will continue to do so until constrained by the forward biasing of the diode. It is a necessary condition, however, if the diode is to be forward biased while the output is still on the vertical part of the characteristic, that:

$$V_{DD} - V_T > V_{diode}\ (V_{diode} = V_{14} \text{ above})$$

If this condition is not fulfilled, then the output will switch to $V_{DD}$ when $V_{in} = V_T$, but the diode will not conduct until $V_{in}<V_T$, so that the circuit does not bias on the vertical part of the characteristic. If the circuit is then used to detect a minimum at A, a much larger positive change in voltage is required at A to cause the output D to change state than would be required if the bias of the circuit falls on the vertical part of the characteristic. Thus for maximum sensitivity when used as a detector of minima, it is important that $V_{DD} - V_T$ be greater than $V_{diode}$.

The value of $V_T$ has been shown to be dependent on process parameters and transistor size ratio. Thus making the n-device large with respect to the p-device reduces the value of $V_T$, so that the vertical part of the characteristic moves closer to 0 volts, which in turn means that the value of $V_{DD}$ at which $V_{DD} - V_T = V_{diode}$ is reduced. As a consequence, operation from low values of $V_{DD}$ is enhanced (in the limit, as $W_N \rightarrow \infty$, $V_T \rightarrow V_{TN}$).

A numerical example will now be considered. FIG. 21 should be referred to. Assume $V_T = 0.75$ volts and $V_{diode}$ $(=V_{14}) = 0.4$ volts, which in turn assumes that the transistors are exactly matched, and $V_{TN} = V_{TP} = 0.4$ volts. As A goes low, point B falls to 0.75 volts when point C increases from 0 volts. When C reaches a value of 0.75 volts + 0.4 volts = 1.15 volts, the diode conducts, capacitor 16 charges, and B is maintained at 0.75 volts (and therefore C at 1.15 volts). Since inverters 10 and 12 are matched, a value of 1.15 volts at C is equivalent to a logical (1) and point D is at 0 volts. A small positive change at A causes a small positive change at B so that the voltage at C falls rapidly. Once the voltage at C passes a value of 0.75 volts, then inverter 12 switches and D changes to 1.5 volts.

If $V_{DD}$ is now reduced, then the value of $V_T$ also reduces, remaining at a value of $V_{DD/2}$ if the transistors are matched, however. Thus for $V_{DD} = 1.0$ volt, $V_T = 0.5$ volts and point C is at $0.5 + 0.4 = 0.9$ volts if point B is at 0.5 volts. Thus point C is still on the "vertical" part of the characteristic.

Now assume that process variations cause a mismatch of the transistors such that, at $V_{DD} = 1.5$ volts, $V_T = 3VDD/4 = 1.12$ volts. Point B at 1.12 volts causes C to increase until C is at $1.12 + 0.4 = 1.42$ volts and the diode conducts. The circuit is still biased with point C on the vertical part of the characteristic, however.

Now if $V_{DD}$ is reduced to 1.0 volt, so that $V_T = 0.75$ volts, if point B is at 0.75 volts, and point C increases, the maximum value of the voltage at point C can only be 1 volt (i.e., $V_{DD}$). The voltage across the diode is thus only 0.25 volts and the diode does not conduct. It is necessary to reduce point B to 0.6 volts before the diode conducts and holds point B at a constant value. Therefore a positive excursion at point B of 150mV is necessary before point C starts to fall to 0 volts, so sensitivity of the circuit is much reduced. It is therefore very desirable to reduce the effect of process variations by increasing the size of the n-transistor. The limiting case is where $W_N \to \infty$ when $V_T = V_{TN} = 0.4$ volts always. In this limiting case the circuit works with maximum sensitivity down to $V_{DD} = 0.8$ volts.

What is claimed is:

1. In combination:

first and second operating voltage terminals;

two complementary-symmetry semiconductor devices, each having a conduction path, and a control electrode for controlling the conductivity of its path, said conduction paths connected in series between said terminals with the first of said devices connected to said first terminal and the second of said devices connected to said second terminal, said two control electrodes connected to an input point, and the connection between said two conduction paths comprising an output terminal, said two devices, so connected, exhibiting an output voltage at one level corresponding to conduction of the first device and said second device cut-off and an output voltage at a second substantially different level corresponding to conduction of the second device and said first device cut off and exhibiting also a rapid change between levels the devices switch state;

a signal input terminal;

a normally open feedback circuit connected between said output terminal and input point; and means, including impedance means coupled between said input terminal and said input point, responsive to the peak values in a given sense of the signal present at said input terminal, for closing and then reopening said feedback circuit during each such peak value of said signal.

2. In the combination as set forth in claim 1, said feedback circuit comprising a diode poled to tend to conduct current in the forward direction from said output terminal to said input point when said first device conducts and said second is cut off.

3. In the combination as set forth in claim 2, further including a transistor, said transistor having base, emitter and collector electrodes and a base-emitter junction, said diode comprising said base-emitter junction.

4. In the combination as set forth in claim 1, said conduction channel of said second device having a substantially greater width thereby a substantially lower impedance when conducting, then said first device, when conducting.

5. In the combination as set forth in claim 1, said impedance means comprising a capacitor connected between said signal input terminal and said input point.

6. In the combination as set forth in claim 5, said means responsive to the peak values in a given sense of said signal further including a resistor connected between said second operating voltage terminal and said input point.

7. In the combination as set forth in claim 1, said two devices comprising a complementary-symmetry, metal-oxide-semiconductor inverter.

8. In the combination as set forth in claim 1, said two devices forming a portion of a NOR gate, said input point serving as one input to said NOR gate and further including a circuit responsive to an inhibit signal for maintaining said output terminal at a fixed voltage level regardless of the value of the voltage present at input point, said circuit having an input terminal to which said inhibit signal may be applied which input terminal serves as a second input terminal to said NOR gate.

9. In combination:

two field effect transistors of different conductivity types, each having a conduction path and a control electrode, the two conduction paths connected in series between two operating voltage terminals, and the connection between said two conduction paths serving as an output terminal;

input terminal means, said means including a common connection to said two control electrodes;

a normally open feedback path connected between said output terminal and said input terminal means; and means coupled to said input terminal means responsive to the peak values in a given sense of an input signal applied to said input terminal means for closing and then opening said feedback each time said input signal reaches said peak value in said given sense.

10. In the combination as set forth in claim 9, said feedback path comprising a diode poled to conduct current passing through one of said conduction paths when said feedback path is closed.

11. In the combination as set forth in claim 10, said diode comprising the emitter-to-base diode of a bipolar transistor, the collector of said transistor being connected to one of said operating voltage terminals.

12. In the combination as set forth in claim 9, further including switch means in said feedback path responsive to an inhibit signal for preventing conduction through said feedback path.

13. In the combination as set forth in claim 9, said feedback path comprising a third field effect transistor having a conduction path coupled between one of said operating voltage terminals and said input terminal means and having a control electrode coupled to said output terminal.

14. In the combination as set forth in claim 13, further including a bipolar transistor having base, emitter, and collector electrodes, said collector electrode being connected to said one of said operating voltage terminals, the base-to-emitter path of said transistor serving to couple the conduction path of said third field effect transistor to said input terminal means.

15. In the combination as set forth in claim 9, said two field effect transistors comprising a complementary symmetry metal oxide semiconductor inverter, and said feedback path connecting from said output terminal to said common connection to said two control electrodes.

16. In the combination as set forth in claim 9, further including a two input terminal NOR gate, said common connection to said two control electrodes comprising the first of the input terminals of said NOR gate further including a third field-effect transistor having a control electrode and a conduction path, said conduction path serving as the connection between the series connected conduction paths of the first-mentioned two transistors, the control electrode of said third transistor comprising the second input terminal to said NOR gate and forming part of said input terminal means, and said feedback path connecting to said first input terminal.

17. In the combination as set forth in claim 9, further including a third field effect transistor having a conduction path and a control electrode, said conduction path comprising said feedback path and further including:

means coupled to said control electrode of said third field effect transistor and responsive to the signal present at said output terminal for controlling the conduction through said third transistor.

18. In the combination as set forth in claim 17, said last named means comprising an inverter.

19. In combination as set forth in claim 17, further including a fourth field effect transistor of different conductivity type than said third field-effect transistor and having a conduction path and a control electrode, said conduction path connected in parallel with that of said third transistor; and means coupled to said control electrode of said fourth transistor and responsive to the signal present at said output terminal for controlling the conduction through said fourth transistor.

20. In the combination as set forth in claim 19, said last named means comprising non-inverting signal translating means.

21. An electronic circuit comprising:

first and second semiconductor devices of different conductivity types arranged in complementary symmetry and each having a conduction path and a control electrode, their conduction paths being coupled in series between two operating voltage terminals;

an output terminal connected to the coupling between said two conduction paths;

input terminal means including an input point at a common connection to said control electrodes of said two devices; and a feedback path coupled between said output terminal and said input terminal means; and means coupled to said input terminal, means responsive to the peak values in a given sense of an input signal applied to said input terminal means for activating and then deactivating said feedback path each time said input signal reaches said peak value in said given sense.

22. A circuit according to claim 21, further including;

a signal input terminal; and wherein said mean responsive to the peak values in a given sense of an input signal comprises a capacitor connected between said signal input terminal and said input point.

23. A circuit according to claim 21 wherein said means responsive to the peak values in a given sense of an input signal further includes a resistor connected between said input point and one of said operating voltage terminals.

24. A circuit according to claim 21 wherein said devices comprise field effect transistors of different conductivity types.

25. A circuit according to claim 24 wherein said two devices form a complementary-symmetry metal-oxide-semiconductor inverter.

26. A circuit according to claim 24 wherein the conduction channel of that one of said devices that is conductive in the active state of the feedback path has a substantially smaller width and thereby a substantially higher impedance when conducting than the other of said devices when conducting.

27. A circuit according to claim 24 wherein said feedback path comprises a third field effect transistor having a conduction path coupled between one of said operating voltage terminals and said input terminal means, and having a control electrode, and further including inverter means responsive to a signal present at said output terminal for applying a signal to said control electrode of said third field effect transistor.

28. A circuit according to claim 27 further including a bipolar transistor with collector electrode connected to said one of said operating voltage terminals, and base-to-emitter path serving to couple the conduction path of said third field effect transistor to said input point.

29. A circuit according to claim 24 wherein said feedback path includes a third field effect transistor having its conduction path coupled between said output terminal and said input point and having a control electrode, and further including inverter means responsive to a signal present at said output terminal for applying a control signal to said control electrode of said third field effect transistor for controlling feedback conduction through said third transistor.

30. A circuit according to claim 29, further including a fourth field effect transistor of different conductivity type than said third field effect transistor having its conduction path connected in parallel with that of said third transistor, and means coupled to a control electrode of said fourth transistor for controlling conduction through said fourth transistor complementarily with respect to that through said third transistor.

31. A circuit according to claim 21 wherein said feedback path comprises a diode poled to conduct current between said output terminal and said input point in response to the voltage existing therebetween following a change in a given sense of the relative conducting states of said devices.

32. A circuit according to claim 21 wherein said diode comprises the emitter-to-base diode of a bipolar transistor, the collector of said transistor being connected to one of said operating voltage terminals.

33. A circuit according to claim 21 further including inhibit circuit means in said feedback path responsive to an inhibit signal for opening said feedback path and thereby preventing conduction through said feedback path.

34. A circuit according to claim 21 wherein said first and second devices form a portion of a NOR gate, said input point serving as one input terminal thereto and further including a circuit responsive to an inhibit signal for mintaining said output terminal at a fixed voltage level regardless of the value of the voltage present at said input point, said circuit having an input terminal to which said inhibit signal may be applied which input terminal serves as a second input terminal to said NOR gate.

35. In combination:

an inverter having an input terminal and an output terminal;

a normally open feedback circuit connected between said two terminals; and means coupled to said input terminal and responsive to the peaks, in a given sense, of the input signal applied to said input terminal for closing and then reopening said feedback path during each such peak of said input signal.

36. In the combination as set forth in claim 35, said means comprising a capacitor through which said input signal is applied to said input terminal.

37. In the combination as set forth in claim 35, said feedback circuit including a semiconductor junction in series with the feedback signal path which is normally reverse biased to maintain said feedback circuit open and wherein said means responsive to the peak in a given sense of said signal operates to forward bias said semiconductor junction only in response to said peaks.

* * * * *

UNITED STATES PATENT OFFICE
CERTIFICATE OF CORRECTION

PATENT NO. : 3,921,010

DATED : November 18, 1975

INVENTOR(S) : Roger Thomas Griffin

It is certified that error appears in the above-identified patent and that said Letters Patent are hereby corrected as shown below:

Claim 1, Column 13, line 49, after "levels" insert --when--.

Claim 4, Column 14, line 3, after "width" insert --and--.

Claim 9, Column 14, line 41, after "feedback" insert --path--.

Claim 16, Column 15, line 10, after"NOR gate" insert--,said NOR gate--.

Claim 19, Column 15, line 31, after "In" insert --the--.

Signed and Sealed this

*second* Day of *March 1976*

[SEAL]

*Attest:*

RUTH C. MASON
*Attesting Officer*

C. MARSHALL DANN
*Commissioner of Patents and Trademarks*